US011270471B2

(12) United States Patent
Connelly et al.

(10) Patent No.: US 11,270,471 B2
(45) Date of Patent: Mar. 8, 2022

(54) EFFICIENT REFINEMENT OF TILES OF A HLOD TREE

(71) Applicant: Bentley Systems, Incorporated, Exton, PA (US)

(72) Inventors: Paul Connelly, Coatesville, PA (US); Raymond B. Bentley, Elverson, PA (US)

(73) Assignee: Bentley Systems, Incorporated, Exton, PA (US)

( * ) Notice: Subject to any disclaimer, the term of this patent is extended or adjusted under 35 U.S.C. 154(b) by 0 days.

(21) Appl. No.: 16/598,593

(22) Filed: Oct. 10, 2019

(65) Prior Publication Data

US 2020/0118303 A1  Apr. 16, 2020

Related U.S. Application Data

(60) Provisional application No. 62/743,983, filed on Oct. 10, 2018.

(51) Int. Cl.
*G06T 11/00* (2006.01)
*H04L 29/08* (2006.01)
(Continued)

(52) U.S. Cl.
CPC .............. *G06T 11/00* (2013.01); *H04L 67/02* (2013.01); *H04L 67/2828* (2013.01); *H04L 67/327* (2013.01); *G06T 2210/04* (2013.01)

(58) Field of Classification Search
CPC ...... G06F 16/9027; G06F 30/13; G06T 11/00; G06T 2210/04; H04L 67/02; H04L 67/2828; H04L 67/327
See application file for complete search history.

(56) References Cited

U.S. PATENT DOCUMENTS 6,326,964 B1  12/2001 Snyder et al.
6,348,921 B1   2/2002 Zhao et al.
(Continued)

OTHER PUBLICATIONS

Bhatia et al, "glTF Specification", KhronosGroup, Jun. 9, 2017, 79 pages.
(Continued)

*Primary Examiner* — Ming Wu
(74) *Attorney, Agent, or Firm* — Cesari and McKenna, LLP; James A. Blanchette

(57) ABSTRACT

In example embodiments, techniques are provided for decoupling user access to infrastructure models from proprietary software that maintains and updates the infrastructure models. A backend application may include an infrastructure modeling backend module that, among other functions, handles communication with an infrastructure modeling frontend module of a frontend application that provides user access to the infrastructure model, infrastructure modeling hub services that maintain repositories for the infrastructure model, and an infrastructure modeling native module that creates, performs operations upon, and updates local instances of a database that stores the infrastructure model. While the infrastructure modeling backend module may pass information obtained from the infrastructure modeling frontend module and infrastructure modeling hub services to the infrastructure modeling native module, it may be functionally separated from the software of the infrastructure modeling native module that understands how to maintain and update infrastructure models, including interacting with local instances of the database.

19 Claims, 12 Drawing Sheets

(51) Int. Cl.
  *H04L 67/63* (2022.01)
  *H04L 67/5651* (2022.01)
  *H04L 67/02* (2022.01)

(56) References Cited

U.S. PATENT DOCUMENTS

| | | | |
|---|---|---|---|
| 6,897,858 | B1 | 5/2005 | Hashimoto et al. |
| 7,283,135 | B1 | 10/2007 | Cote et al. |
| 7,519,603 | B2 | 4/2009 | Parker |
| 7,538,769 | B2 | 5/2009 | Hoppe |
| 9,865,085 | B1* | 1/2018 | Eng .................. G06T 19/00 |
| 2008/0270529 | A1 | 10/2008 | Cavagna et al. |
| 2013/0016108 | A1 | 1/2013 | Isozu |
| 2013/0325903 | A1* | 12/2013 | Rohlf .............. G06F 16/2246 707/797 |
| 2014/0274154 | A1 | 9/2014 | Rana et al. |
| 2015/0347458 | A1* | 12/2015 | Hong ................ G01C 21/32 707/722 |
| 2015/0358633 | A1 | 12/2015 | Choi et al. |
| 2015/0363969 | A1 | 12/2015 | Yang |
| 2016/0239660 | A1* | 8/2016 | Azvine .............. G06F 21/55 |
| 2017/0084043 | A1 | 3/2017 | Khandelwal et al. |
| 2017/0206648 | A1 | 7/2017 | Marra et al. |
| 2017/0309027 | A1 | 10/2017 | Kleen et al. |
| 2017/0315696 | A1 | 11/2017 | Jacobson et al. |
| 2017/0372509 | A1 | 12/2017 | Paltashev et al. |
| 2019/0108245 | A1 | 4/2019 | Bentley et al. |
| 2019/0163349 | A1 | 5/2019 | Derner et al. |
| 2019/0311535 | A1 | 10/2019 | Lacey |
| 2020/0058169 | A1 | 2/2020 | Friesenhahn et al. |

OTHER PUBLICATIONS

Erikson, Carl, et al., "HLODs for Faster Display of Large Static and Dynamic Environments," ACM, Proceedings of the 2001 Symposium on Interactive 3D Graphics, I3D'2001, Research Triangle Park, NC, USA, Mar. 1, 2001, pp. 111-121.

Martin, Ioana M., "Adaptive Rendering of 3D Models Over Networks Using Multiple Modalities," IBM Research Division, IBM Research Report, Computer Science/Mathematics, RC 21722 (Log 97821), Apr. 11, 2000, pp. 1-11.

"Notification of Transmittal of the International Search Report and the Written Opinion of the International Searching Authority, or the Declaration," International Filing Date: Oct. 10, 2019, International Application No. PCT/US2019/055512, Applicant: Bentley Systems, Incorporated, dated Feb. 7, 2020, pp. 1-14.

"Notification of Transmittal of the International Search Report and the Written Opinion of the International Searching Authority, or the Declaration," International Filing Date: Oct. 10, 2019, International Application No. PCT/US2019/055569, Applicant: Bentley Systems, Incorporated, dated Dec. 17, 2019, pp. 1-16.

Park, Jong-Seung, et al., "Hierarchical Contribution Culling for Fast Rendering of Complex Scenes," Springer-Verlag Berlin Heidelberg, Advances in Image and Video Technology. PSIVT, Dec. 2006. Lecture Notes in Computer Science, vol. 4319, 2006, pp. 1324-1333.

Rischbeck, Thomas, et al., "A Scalable, Multi-User VRML Server," IEEE, IEEE Computer Society, Proceedings of the IEEE Virtual Reality 2002 (VR'02), Los Alamitos, California, Mar. 24-28, 2002, pp. 199-206.

Schneider, Bengt-Olaf, et al., "An Adaptive Framework for 3D Graphics Over Networks," Elsevier Science, Ltd., Pergamon, Computers & Graphics, IMC'98, vol. 23, No. 6, Dec. 1999, pp. 867-874.

Teler, Eyal, et al., "Streaming of Complex 3D Scenes for Remote Walkthroughs," Blackwell Publishers, The Eurographics Association and Blackwell Publishers, Eurographics 2001, vol. 20, No. 3, Sep. 4, 2001, pp. 1-9.

Westerteiger, Rolf, et al., "Remote GPU-Accelerated Online Preprocessing of Raster Maps for Terrain Rendering," Virtuelle und Erweiterte Realitaet—9, Workshop der GI-Fachgruppe VR/AR 2012, Duesseldorf, Germany, 2012, pp. 1-12.

Bentley et al., U.S. Appl. No. 16/559,057 for "Techniques for Decoupling Access To Infrastructure Models", filed Sep. 3, 2019, 26 pages.

Cozzi, Patrick, "Cesium 3D Tiles", Aug. 19, 2015, 14 pages.

Cozzi et al, "3D Tiles Specification 1.0", Cesium and Open Geospatial Consortium, Jun. 5, 2018, 127 pages.

Erikson et al, "HLODs for Faster Display of Large Static and Dynamic Environments", Department of Computer Science, University of North Carolina at Chapel Hill, Mar. 1, 2001, 11 pages.

Schilling, Arne, "Using glTF for Streaming CityGML 3D City Models," ACM, Web3D '16: Proceedings of the 21st International Conference on Web3D Technology, Anaheim, California, USA, Jul. 22-24, 2016, pp. 109-116.

Gaillard, J., et al., "A Data structure for Progressive Visualisation and Edition of Vectorial Geospatial Data," ISPRS Annals of the Photogrammetry, Remote Sensing and Spatial Information Sciences, vol. IV-2/W1, 2016, 11$^{th}$ 3D Geoinfo Conference, Athens, Greece, Oct. 20-21, 2016, pp. 201-209.

* cited by examiner

EFFICIENT REFINEMENT OF TILES OF A HLOD TREE

RELATED APPLICATIONS

Priority is claimed to previously filed U.S. Provisional Patent Application No. 62/743,983 filed on Oct. 10, 2018 for EFFICIENT REFINEMENT OF TILES OF A HLOD TREE by Connelly et al., the contents of which are incorporated herein by reference in their entirety.

BACKGROUND

Technical Field

The present disclosure relates generally to infrastructure modeling, and more specifically to the display of views of infrastructure models utilizing tiles.

Background Information

Throughout the design, construction and operation of infrastructure (e.g., buildings, factories, roads, railways, bridges, electrical and communications networks, etc.) it is often desirable to model the infrastructure using infrastructure modeling applications. Infrastructure modeling applications traditionally have used a variety of different technologies and data formats to maintain infrastructure descriptions for different phases of the project. In the past, infrastructure models maintained according to such formats have been disjointed, and have included substantial data redundancies and other sources of inefficiency. The models may have been optimized and adapted for particular use cases, without much regard for other phases of the infrastructure project, leading to distinct product/discipline/phase data silos.

More recently, systems have been developed that can break down such existing product/disciple/phase data silos and enable the generation of a true "digital twin" of real-world infrastructure that describes aspects of infrastructure in a unified manner. Generation of this sort of "digital twin" has addressed many of the limitations of traditional infrastructure modeling techniques. However, it has also lead to technical challenges.

One of these challenges involves how to efficiently display a view of an infrastructure model on a client device. Since client devices may lack processing and storage capabilities for generating views themselves, they may instead rely upon cloud computing devices to "publish" the model. In traditional "publishing", the cloud computing devices may generate a set of tiles (e.g., two-dimensional (2D) or three-dimension (3D) tiles) that represent the infrastructure model at different levels-of-detail (LODs). The tiles may be arranged in a hierarchy, in which tiles are sub-divided into multiple child tiles that each include a smaller space (e.g., volume), but at a higher LOD. The tiles may be served to the client devices, which simply display them to a user. When a user zooms in more closely on a portion of the infrastructure model, higher LOD tiles may be requested and served.

However, such traditional model "publishing" techniques have a number of shortcomings. For example, traditional tile sub-division techniques often limit the LOD that may be displayed to a user, or may impose excessive processing, network bandwidth and storage burdens on underlying hardware. For example, if the tiles are statically generated on the cloud computing devices (i.e. generated in advance and stored until requested), the LOD available to client devices may be artificially limited. If a user should zoom in closely enough on an element having a curved geometry, the element may appear "blocky" (i.e. as if composed of a number of planer or linear facets) despite its geometry defining a smooth curve. If the tiles are dynamically generated on the cloud computing devices (i.e. generated upon request, rather than in advance), additional tiles may be generated through tile sub-division to an arbitrary LOD, such that an element having a curved geometry will appear with a smooth curve, no matter how closely a user zooms in. However, such tile sub-division may produce an exponentially increasing number of tiles. This exponentially increasing number of tiles may impose an exponentially-increasing burden on the processing, network bandwidth, and the storage resources of both the client and cloud computing devices. These burdens may rapidly overwhelm the resources of the hardware.

Accordingly, there is a need for improved techniques for displaying a view of an infrastructure model on a client device using tiles, which may allow for a user to zoom arbitrarily closely without imposing excessive resource burdens on underlying hardware.

SUMMARY

Techniques are provided for refining tiles of a hierarchical level of detail (HLOD) sub-tree into child tiles utilizing a single-tile refinement strategy that, for a given parent tile, generates a single child tile occupying the same space (e.g., volume) as the parent tile, but has a higher resolution than the parent tile (e.g., a higher number of pixels). Such refinement strategy may be used in place of, or addition to (i.e. at different nodes in the HLOD sub-tree), a multiple-child tile refinement strategy that subdivides a parent tile into multiple child tiles. When single-tile refinement is used, the number of tiles in the HLOD sub-tree may increase linearly, rather than exponentially, conserving processing, network bandwidth, and storage resources of both client and cloud computing devices, thereby avoiding the excessive resource consumption that has previously threatened to overwhelm hardware.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION

Figure 1:
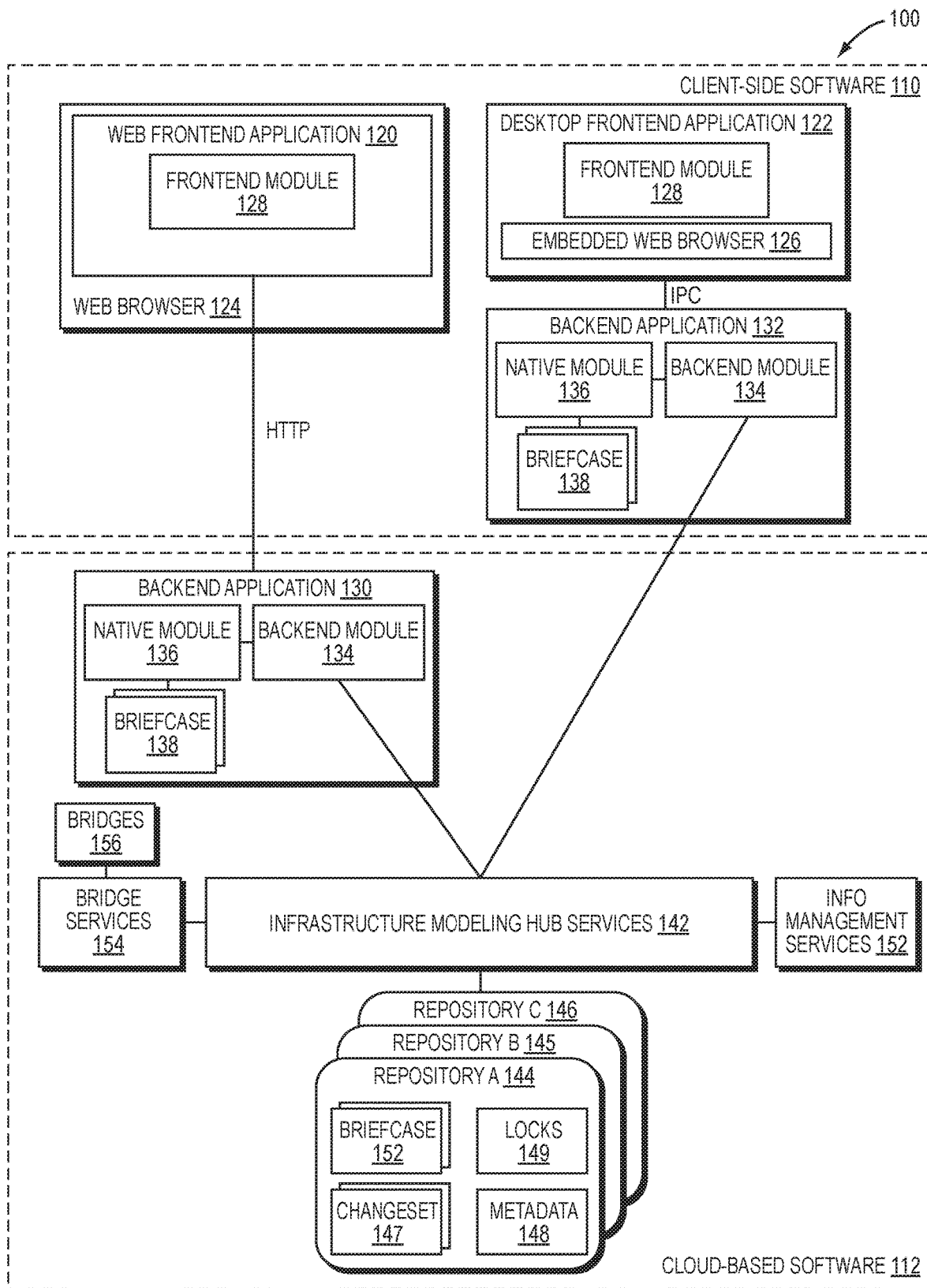
FIG. 1 is a high-level block diagram of an example infrastructure modeling software architecture.

FIG. 1 is a high-level block diagram of an example infrastructure modeling software architecture 100. The architecture may be divided into client-side software 110 that executes on one or more computing devices provided local to an end-user (collectively "client devices") and a cloud-based software 120 that is executed on one or more computing devices provided remote from the end-user (collectively "cloud computing devices"), accessible via a network (e.g., the Internet). The client-side software 110 may include web frontend applications 120 that operate within a virtual environment (e.g., a "browser sandbox") provided by a web browser 124 (e.g., the Chrome® web browser), and desktop front-end applications 122 that operate directly under an operating system and backend applications 132 that interact therewith. The cloud-based software 112 services software and backend applications 130 that interact with the web front-end applications 120.

The core of the service software may be infrastructure modeling hub services (e.g., iModelHub™ services) 142 that provides centralized management and synchronization support to an infrastructure model (e.g., an iModel® model) that serve as a "digital twin" of physical infrastructure. As used herein, the term "infrastructure" refers to a physical structure or object that has been built, or is planned to be built, in the real-world. Examples of infrastructure include buildings, factories, roads, railways, pipe networks, etc. The infrastructure model (e.g., an iModel® model) may be a 2D or 3D "digital twin" of such buildings, factories, roads, railways, pipe networks, etc.

Infrastructure modeling hub services (e.g., iModelHub™ services) 142 maintains an infrastructure model (e.g., an iModel® model) in repositories 144-146 that include briefcases 152, a set of accepted changesets 147, metadata 148 (e.g., that includes storage locations, lookup identifiers, sequence information, etc. about the changesets), and locks 149. As used herein, the term "repository" refers to a distributed database. As used herein, the term "briefcase" refers to a particular instance of a database (e.g., a SQLite database). A briefcase may be used as a constituent database of a repository. As used herein, the term "changeset" refers to a persistent record that captures changes needed to transform a particular briefcase from one valid state to a new valid state.

A briefcase 152 in a repository 144-146 may begin as an empty "baseline" briefcase that is programmatically generated and persisted by infrastructure modeling hub services (e.g., iModelHub™ services) 142. A repository 144-146 may be modified by accepting new changesets into the sets of accepted changesets 147. As the number of changesets in the sets of accepted changesets 147 grows, the time required to take an empty "baseline" briefcase and apply all changesets needed to transform it into a briefcase at a specific version (e.g., the "most recent version") may grow large. For this reason, infrastructure modeling hub services (e.g., iModelHub™ services) 142 may create additional "snapshot" briefcases 152 at different versions. When a specific version (e.g., the "most recent version") of a briefcase is needed, the briefcase 152 closest to such version (which may be a "snapshot" briefcase) is accessed and changesets (or reverse changesets) from the set 147 are applied until a briefcase of the needed version is obtained.

The infrastructure model (e.g., the iModel® model) maintained in the briefcases 152 of the repositories 144-146 may be defined utilizing a conceptual schema (e.g., Built Infrastructure Schema (BIS)) and stored using an underlying database schema (e.g., DgnDb). The conceptual schema defines semantics, data structures and concepts used for modeling infrastructure. Physical information may serve as a "backbone" of the "digital twin", and non-physical information (e.g., analytical information, functional information, informational information etc.) may be maintained relative to (e.g., augmenting) the "backbone." Elements, models, element aspects and relationships may serve as building blocks of the conceptual schema. In this context, an element is the finest-grained record that can be individually identified and locked is the element, which represents (i.e. models, in a colloquial sense of the term) an entity in the real-world. A set of closely-related elements may represent a complete object. One element may be the "lead" element, based on the nature of the object being modeled. Other elements typically relate back the lead element. A model is a container for a set of elements where the set of elements collectively represent (i.e. "model", in a colloquial sense of the term) an entity in the real-world. The model owns the elements that it contains and provides context for the elements. Each element is contained in a single model. Every model models some element (that is not contained in that model), with the exception of a repository model, that operates similar to a table of contents. Models may be arranged according to a model hierarchy to support modeling from multiple perspectives. A single repository model may serve as a root of the model hierarchy. A relationship is a connection that relates two or more elements, element aspects or models. Examples of relationships include parent-child relationships that imply ownership and peer-to-peer relationships that define groups or interconnections. In one embodiment, two types of relationships may be provided, with an abstract relationship prohibiting instantiations but permitting inheritance therefrom, and a sealed relationship prohibiting inheritance. Likewise, an element aspect describes a set of properties that belong to a particular element, but that may have an independent lifecycle (e.g., may come and go over the lifetime of an element). An element aspect is typically not individually identifiable and lacks incoming relationships other than from the element that owns it.

The infrastructure modeling hub services (e.g., iModelHub™ services) 142 may interact with a number of other services in the cloud, that perform information management and support functions. For example, information management services 152 may manage asset data, project data, reality data, Internet of Things (IoT) data, codes, and other features. Further, bridge services 154 may work together with infrastructure modeling infrastructure modeling hub services (e.g., iModelHub™ services) 142 to permit interoperation with legacy data source (not show), incrementally align data using source-format-specific bridges 156 that know how to read and interpret source data of legacy formats. A wide variety of additional services (not shown) may also be provided and interact with infrastructure modeling hub services (e.g., iModelHub™ services) 142.

In order to permit access to the infrastructure models (e.g., the iModel® models) maintained in the briefcases 152 of the repositories 144-146, backend applications 130, 132 may be provided. As mentioned above, some backend applications 130 may be located in the cloud as part of cloud-based software 112, while others may be located on a client device as part of client-side software 110. The backend applications 130, 132 may maintain local copies of briefcases 138 and changesets needed to transform them into briefcases of a desired version of the repository 144-146. The backend applications 130, 132 may subscribe to notification functions provided by infrastructure modeling hub services (e.g., iModelHub™ services) 142 to receive notifications regarding new changesets in the repository's set of accepted changesets 147. The backend applications 130, 132 may then "pull" (download) the new changeset(s) and apply them to their briefcases 138 to update them to the new version. Similar operations may occur when backend applications 130, 132 modify briefcases 138, to propagate changes.

A backend application 130, 132 may include functionality for servicing requests from frontend applications 120, 122, including requests for initial metadata used to calculate a HLOD sub-tree, and requests for tiles and accompanying metadata used to grow the HLOD sub-tree. Such functionality may be implemented by an infrastructure modeling backend module (e.g., a iModel.js Backend module) 134. The infrastructure modeling backend module (e.g., a iModel.js Backend module) 134 may rely upon an infrastructure modeling native module (e.g., an iModel.js Native module) 136 to perform a number of different operations that require access to briefcases 138.

The frontend applications 120, 122 are concerned mainly with providing a user interface for displaying and enabling user interaction with an infrastructure model (e.g., an iModel® model). Some frontend applications may be a web frontend applications 120 that operate within a virtual environment (e.g., a "browser sandbox") provided by a web browser (e.g., the Chrome® web browser) 124 on a client device, while other frontend applications may be desktop front-end applications 122 that execute as stand-alone applications, interacting directly with an operating system of a client device. Desktop front-end applications 122 may include embedded web browser code (e.g., Chromium® code) 126 to permit them to interact with backend applications 132 in a similar manner as web front-end applications 120, with a few exceptions.

Frontend applications 120, 122 may provide functionality for calculating an initial HLOD sub-tree, requesting and displaying specific tiles of the HLOD sub-tree, and determining how tiles should be refined to grow the initial HLOD sub-tree using metadata of the tiles, as well as a variety of other functionality. Such functionality may be implemented by an infrastructure modeling frontend module (e.g., a iModel.js Frontend module) 128 that sends requests to the infrastructure modeling backend module (e.g., a iModel.js Backend module) 134 of a backend application 130, 132. Depending upon whether the frontend application 120, 122 is a web frontend application 120 or desktop front-end application 122, the requests may be sent differently, for example via a web protocol (e.g., HyperText Transfer Protocol (HTTP)) or via inter-process communication (IPC).

The above described infrastructure modeling software architecture 100 may be used with techniques for refining tiles into child tiles utilizing a single-tile refinement strategy that, for a given parent tile, generates a single child tile occupying the same space (e.g., volume) as the parent tile, but has a higher resolution than the parent tile. Such a single-tile refinement strategy may be implemented as part of a frontend-driven, incremental HLOD sub-tree creation and dynamic tile generation technique. An infrastructure modeling frontend module (e.g., a iModel.js Frontend module) 128 of a frontend application 120, 122 may incrementally create a local HLOD sub-tree, beginning with an initial HLOD sub-tree based on initial metadata provided without tile contents, and refined based on metadata provided with tile contents from the infrastructure modeling backend module (e.g., a iModel.js Backend module) 134 of a backend application 130, 134. The local HLOD sub-tree of each infrastructure modeling frontend module 128 may differ based on the individual tiles requested and the tile refinement strategies employed. The infrastructure modeling backend module 134 may supply initial metadata without tile contents, dynamically generate tiles upon request from the infrastructure modeling backend module 128, store requested tiles in a tile cache, and serve them from the tile cache along with metadata, to support display of a view of the infrastructure model and the incremental generation of the local HLOD sub-tree. The number of tiles required to be generated, cached and served may be reduced by using the single-tile refinement strategy for at least some tile refinements, thereby conserving processing, network bandwidth, and storage resources of the underlying hardware.

Figure 2:
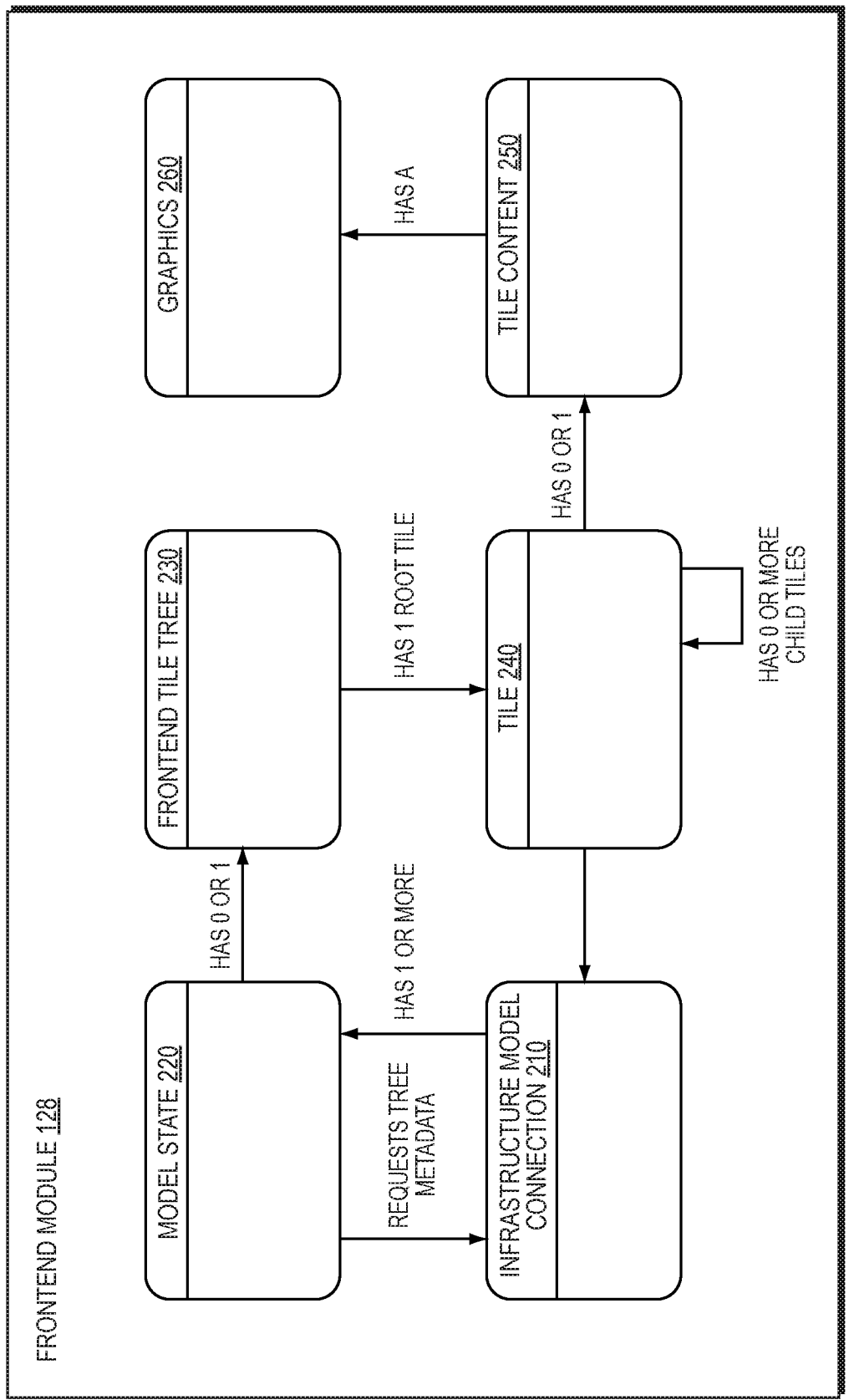
FIG. 2 is a block diagram of example software classes of an infrastructure modeling frontend module that may be executed as part of a frontend application on a client device.

FIG. 2 is a block diagram of example software classes of an infrastructure modeling frontend module (e.g., iModel.js Frontend module) 128 that may be executed as part of a frontend application 120, 122 on a client device. An infrastructure model connection object 210 may include an application program interfaces (API) for making a connection with a briefcase 138 managed by an infrastructure modeling backend module 128 and requesting information therefrom. An infrastructure model connection object 210 may have one or more model state objects 220 that maintain a front-end representation of the infrastructure model, and contain APIs for obtaining graphics for rendering its contents on a display screen of the client device. Each model state object 220 may have zero or one frontend tile tree objects 230 that operate as a container for a local HLOD sub-tree.

The frontend tile tree objects 230 may provide an API for obtaining graphics objects for the portion of the infrastructure model that is to be rendered on the display screen of the client device. This may involve determining which tiles intersect at a desired LOD, generating nodes on the HLOD sub-tree as needed, and requesting contents of those tiles from the infrastructure modeling backend module 128, if not already available locally. To this purpose, a frontend tile tree object 230 may maintain location information, a space (e.g., volume) of the HLOD sub-tree, and a tile screen size (e.g., as a number of pixels).

A tile object 240 may represent a node in the local HLOD sub-tree. A tile object 240 may have zero or one tile contents objects 250 that have graphics objects 260 that can be submitted to a rendering system on the client device to draw tile contents on the display screen. It may have no tile content objects 250 until tile contents are requested from the infrastructure modeling backend module 128, which generally occurs the first time the tile needs to be rendered. A tile object 240 may maintain a tile volume occupied by the tile. Further, a tile object 240 may maintain a content status indicating availability of contents of the tile. For example, a content status of "not loaded" may indicate no request has yet been made for contents of the tile, a content status of "enqueued" may indicate a request has been made but a response is still being awaited, a content status of "loading" may indicate a response has been received and is being processed, and a status of "ready" may indicate contents of the tile have been received and stored in a tile content object 250 to be rendered. Further, the tile object 240 may maintain an indication of a refinement strategy that determines when and how to refine the tile. The tile refinement strategy may be a multiple-child refinement strategy, or the above discussed single-tile refinement strategy, depending on the tile. When not applied, the tile may be treated as a terminating node.

Figure 3:
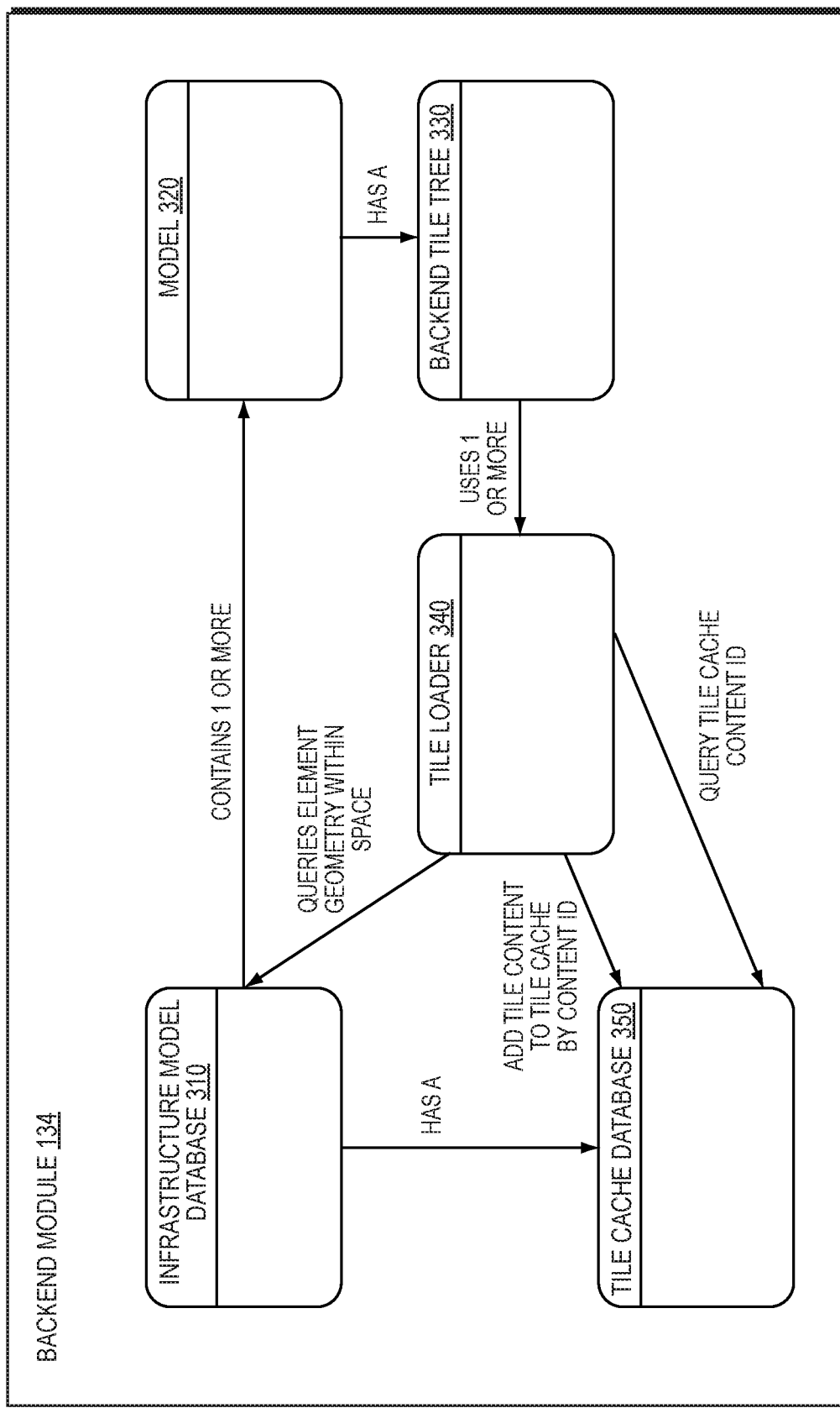
FIG. 3 is a block diagram of example software classes of an infrastructure modeling backend module that may be executed as part of a backend application on a client device or a cloud computing device.

FIG. 3 is a block diagram of example software classes of an infrastructure modeling backend module (e.g., iModel.js Backend module) 134 that may be executed as part of a backend application 130, 132 on a client device or a cloud computing device. An infrastructure modelling database object 310 may provide access to (e.g., hold open) a briefcase 138, which contains one or more models 320. As discussed above, a model owns one or more elements, containing and providing context for them. Each model 320 may have zero or one backend tile tree objects 330 that provide an API for obtaining metadata and tile contents. To this purpose, a backend tile tree object 330 may maintain a location in the infrastructure model and a space (e.g., volume) of the portion of the HLOD tree known to the infrastructure model backend module 134.

When contents of a tile are requested, the backend tile tree objects 330 may use one or more tile loader objects to asynchronously obtain tile contents, indexed by an algorithmically-generated content ID. The backend tile tree objects 330 may maintain a set of active tile loader objects 330, and multiple requests for the same tile content may be fulfilled by the same tile tree object 330. Each tile loader object 330 may manage the storage of contents of a tile occupying a tile space (e.g., volume), according to a content ID. The tile contents may be structured as a binary array. In operation, a tile loader object 340 may determine whether tile contents are already present in a tile cache of the backend module 134 by querying a tile cache database object 350. If already present, the tile loader object 340 may return the tile contents along with metadata related thereto. If not already present, the tile loader object 340 may query the infrastructure modeling database object 310 to obtain geometry within the space (e.g., volume) of the tile, generate tile contents, return the tile contents and metadata related thereto, and also call the tile cache database object 350 to add the contents to the tile cache.

Figure 4:
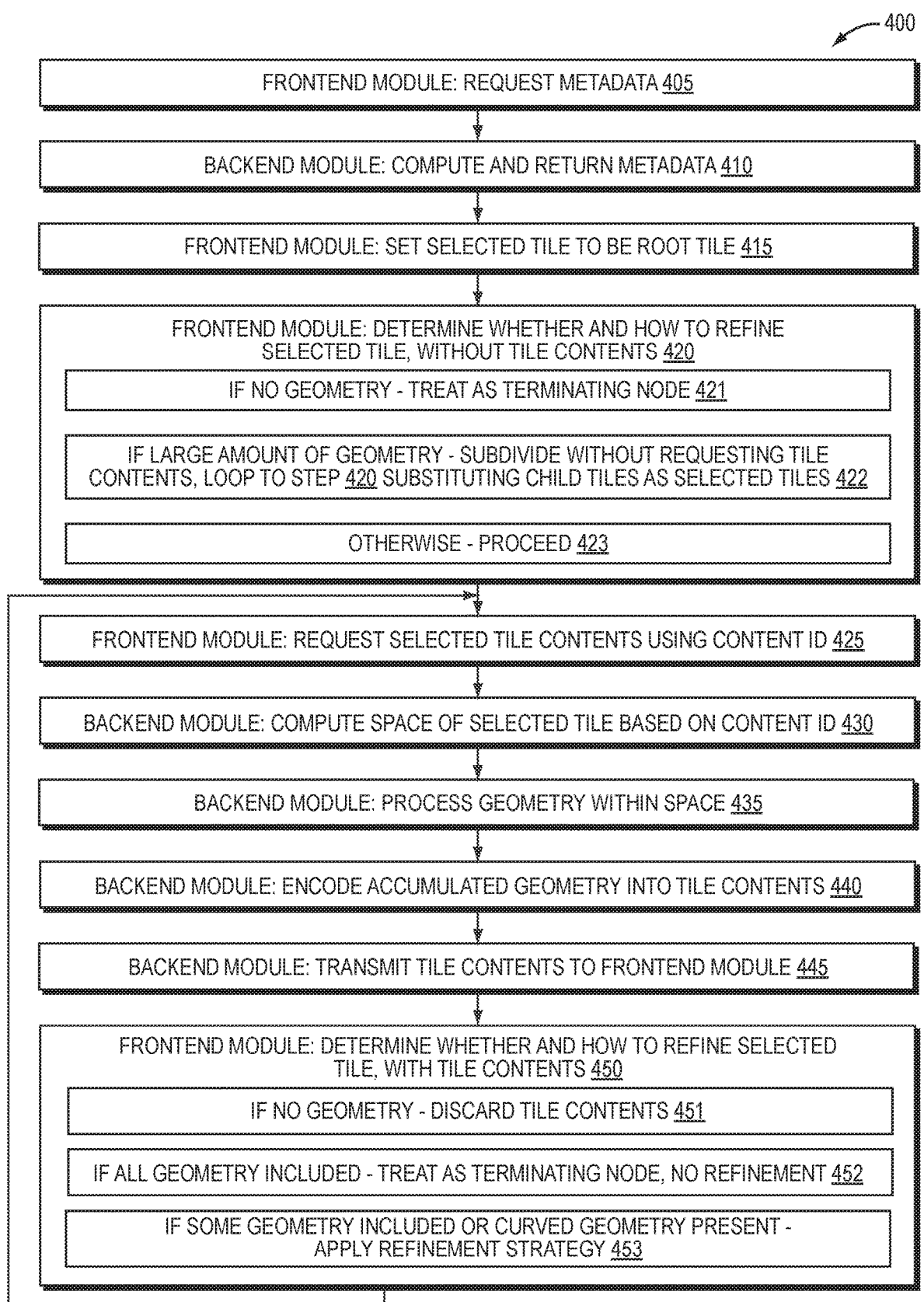
FIG. 4 is a flow diagram of an example sequence of steps for frontend-driven, incremental HLOD sub-tree creation and dynamic generation of tiles to display a view of an infrastructure model (e.g., an iModel® model)

FIG. 4 is a flow diagram of an example sequence of steps 400 for frontend-driven, incremental HLOD sub-tree creation and dynamic generation of tiles (e.g., 2D or 3D tiles) to display a view of an infrastructure model (e.g., an iModel® model). The steps 400 may be implemented by the above discussed objects of the infrastructure modeling frontend module (e.g., iModel.js Frontend module) 128 and infrastructure modeling backend module (e.g., iModel.js Backend module) 134, however the individual objects have been abstracted here to facilitate understanding of overall process flow. At step 405, the infrastructure modeling frontend module 128 on a client device requests metadata for a view of an infrastructure model which is to be displayed on a display screen. At step 410, the infrastructure modeling backend module computes and returns initial metadata, including a space (e.g., volume) occupied by the infrastructure model in the view, and a measure of an amount of geometry contained. The infrastructure modeling frontend module 128 then begins to generate a local HLOD sub-tree.

At step 415, the infrastructure modeling frontend module 128 sets a selected tile to be a root tile and a selected space (e.g., volume) to be the entire space (e.g., volume) occupied by the infrastructure model. At step 420, the infrastructure modeling frontend module 128 determines whether and how to sub-divide the selected tile, without tile contents. At sub-step 421, if the selected tile includes no geometry, the selected tile is treated as a terminating node and nothing further is done. At sub-step 422, if the selected tile includes a measure of geometry greater than a predetermined threshold (e.g. indicating a "large amount" of geometry), no tile contents are requested and the selected tile is refined using a multiple child tile refinement strategy in which the tile is subdivided into multiple (e.g., 8, 4, etc.) child tiles each occupying a portion of the space (e.g., a sub-volume of the volume) of the tile but having a higher resolution than the tile (e.g., a higher number of pixels), and the local HLOD sub-tree is updated to add the additional child tiles. Execution then loops back to step 420, substituting each of the newly created child tiles as the selected tile. Otherwise, at step 423, execution proceeds to where tile contents will be requested.

At step 425, the tile contents for a selected tile generated in the steps above are requested by the infrastructure modeling frontend module 128. To request the selected tile, the infrastructure modeling frontend module 128 algorithmically computes a content ID describing the tile's position in the local HLOD sub-tree and a desired LOD to the infrastructure modeling backend module 128. At step 430, the infrastructure modeling backend module 128 computes the space (e.g., volume) of the selected tile based on the supplied content ID. At step 435, the infrastructure modeling backend module 128 processes geometry within the space (e.g., volume), retaining geometry that contributes visibly at the LOD (at the resolution), while discarding geometry too small to contribute visibly at the LOD (at the resolution), to produce an accumulated geometry set. At step 440, the accumulated geometry set and metadata is encoded (e.g., using a variant of the GL Transmission Format (gITF)) into tile contents and added to the tile cache at the infrastructure modeling backend module 134. The metadata may include a measure of geometry (e.g., a number of elements processed and a number of elements skipped), an indicator of curved geometry (e.g., its presence or lack thereof), and an indicator that some geometry was excluded due to size (e.g., that there was some additional geometry available that was too small to visibly contribute). At step 445, the tile contents are also transmitted to the infrastructure modeling frontend module 128.

At step 450, the infrastructure modeling frontend module 128 determines whether and how to refine the selected tile given the desired LOD. At sub step 451, if the measure of geometry in the tile-specific metadata indicates no geometry is included, the tile may be discarded. At sub step 452, if the measure of geometry in the tile-specific metadata indicates all geometry was included, it is concluded that the selected tile is already at a maximal resolution, the tile is marked as a terminating node in the local HLOD sub-tree, and no refinement is performed. At sub step 453, if the measure of geometry in the tile-specific metadata or the indicator that some geometry was excluded due to size indicates some geometry was excluded from the tile contents, or the indicator of curved geometry indicates the presence of curved geometry, the infrastructure modeling frontend module 128 concludes that the selected tile may be displayed at a higher resolution and a tile refinement strategies may be applied.

As discussed above, the tile refinement strategy may be a multiple-child tile refinement strategy, in which the tile is subdivided into multiple (e.g., 8, 4, etc.) child tiles each occupying a portion of the space (e.g., a sub-volume of the volume) of the tile but having a higher resolution than the tile (e.g., a higher number of pixels), and the local HLOD sub-tree is updated to add the multiple child tiles, similar to as in step 422 above. Alternatively, the tile refinement strategy may be a single-tile refinement strategy in which a single child tile is generated occupying the same space (e.g., volume) as the tile, but having a higher resolution than the tile (e.g., a higher number of pixels), and the local HLOD sub-tree is updated to add the single child tile. In such case, the local HLOD sub-tree is updated to add only a single child tile. Execution may then loop back to step 425, substituting a different tile for the selected tile as needed to obtain refined tiles for the desired LOD for the view of the infrastructure model being shown on the display screen of the client device.

Figure 5:
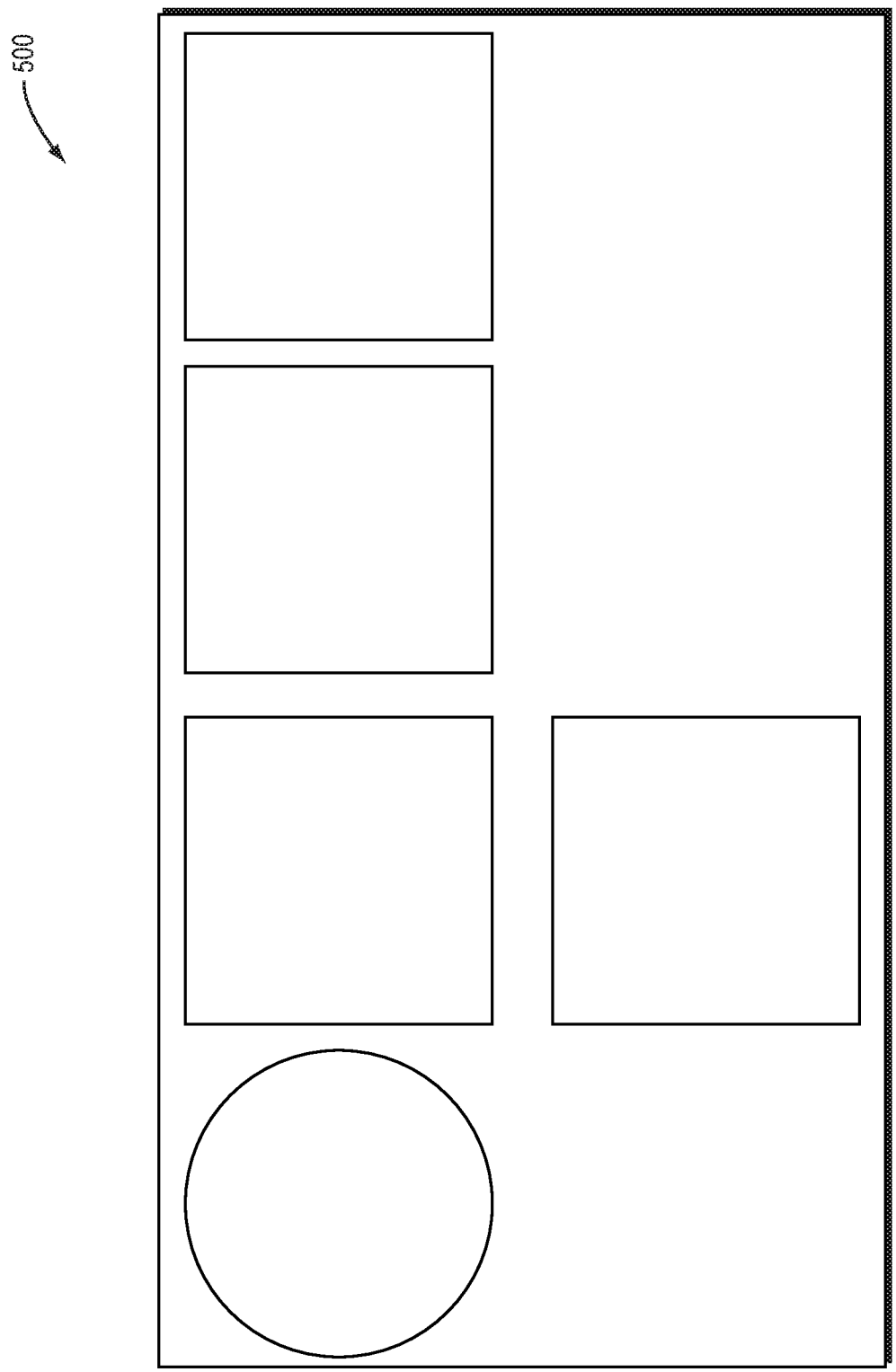
FIG. 5 is a graphical depiction of an example infrastructure model.

The above techniques may be illustrated by reference to an illustrate example, as shown in FIGS. 5-11. FIG. 5 is a graphical depiction of an example infrastructure model 500, including elements having curved geometry such as a circle, and elements without curved geometry, such as squares. It should be understood that a typical infrastructure model will generally have a far greater level of complexity, and the simple shapes included here are merely for purposes of illustration. Further, while this infrastructure model 500 is shown in 2D, it should be understood that infrastructure models often will be three-dimensional.

Figure 6:
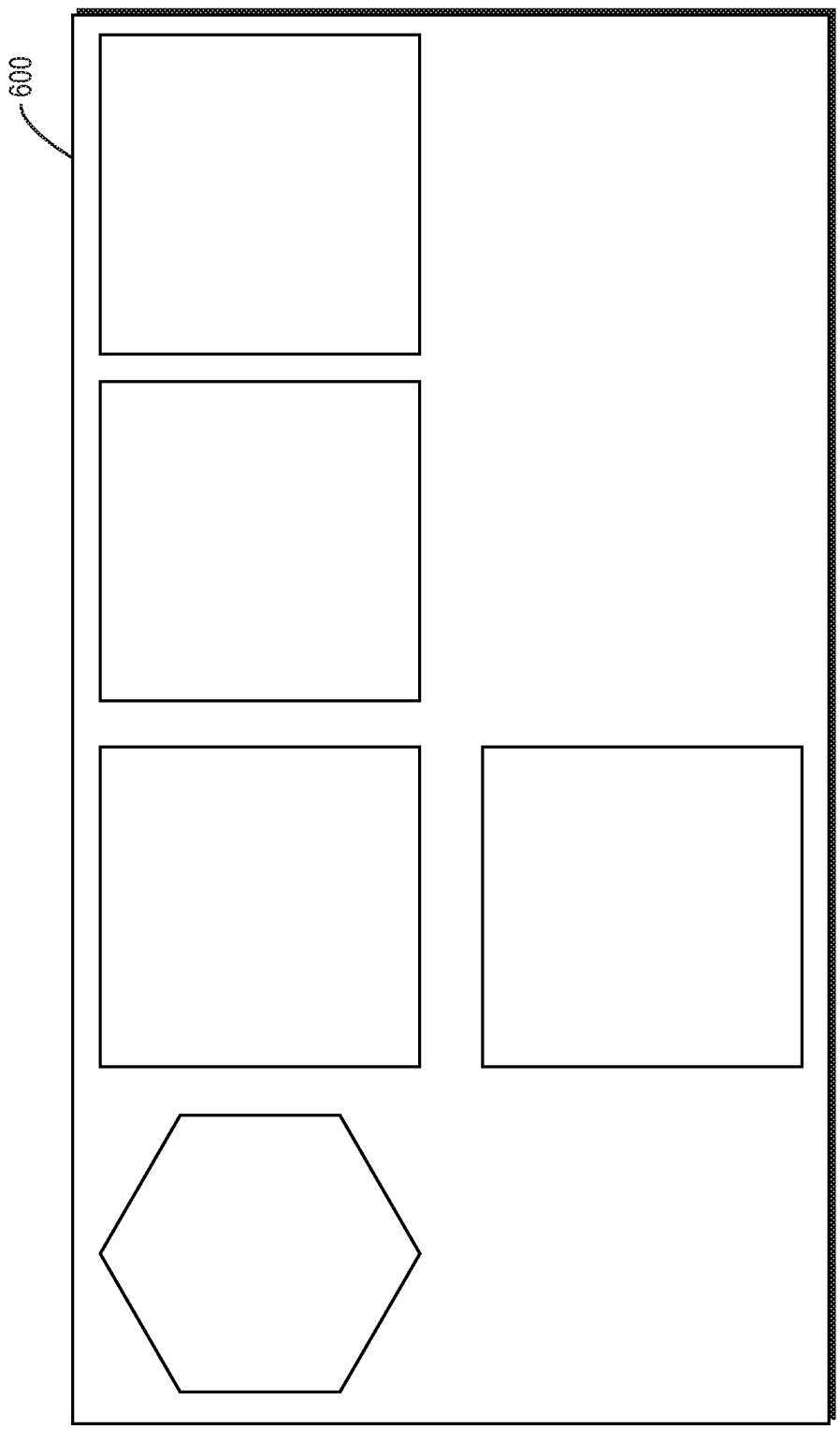
FIG. 6 is a graphical depiction of an example root tile for a view of the entire infrastructure model of FIG. 5.

FIG. 6 is a graphical depiction of an example root tile 600 for a view of the entire infrastructure model 500 of FIG. 5. The root tile may be selected as part of step 415 of FIG. 4 above. As can be seen, at a LOD of the root tile, the curved geometry of the circle may appear "blocky", here with 6 linear facets.

Figure 7:
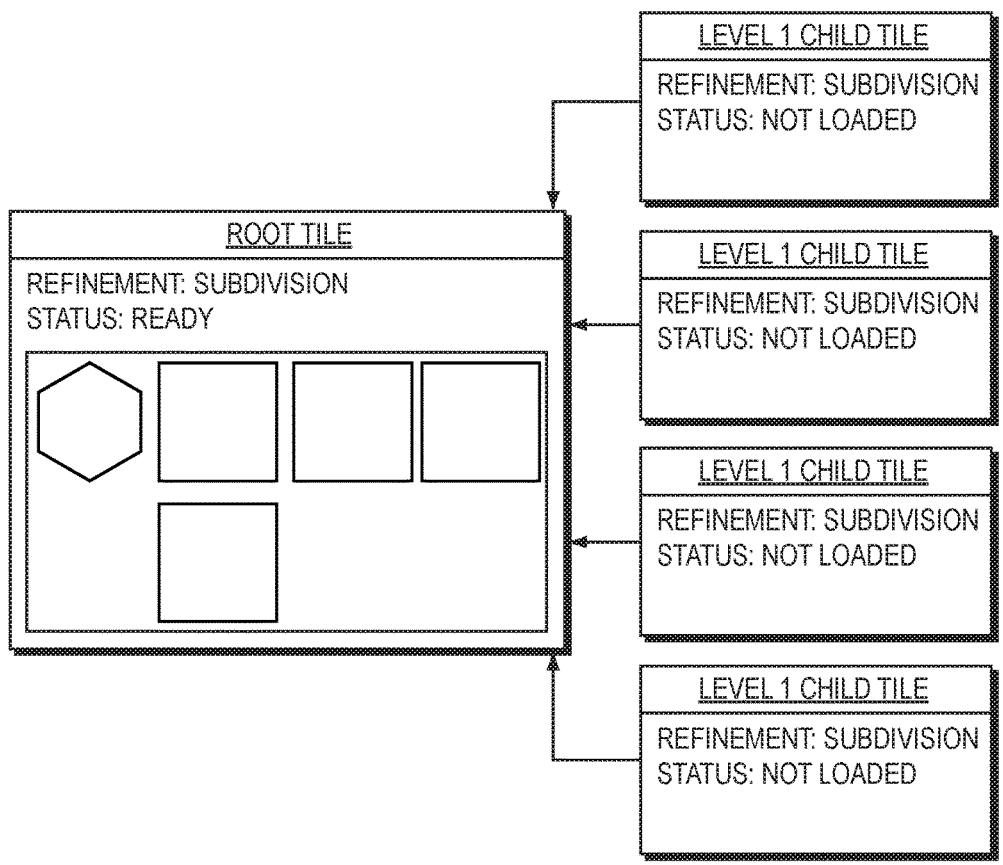
FIG. 7 is a diagram illustrating initial states of an example local HLOD sub-tree generated by an infrastructure modeling frontend module.

FIG. 7 is a diagram illustrating initial states of an example local HLOD sub-tree generated by the infrastructure modeling frontend module (e.g., iModel.js Frontend module) 128. A first local HLOD sub-tree 710 represents an initial state, with the root tile 600 from FIG. 6 not yet loaded. A second local HLOD sub-tree 720 represents a later state, after the infrastructure modeling frontend module 128 has load the root tile 600 and sub-divided the root tile into child tiles by applying a multiple-child tile refinement strategy, by execution of step 425-450 above with the selected tile being the root tile 500.

Figure 8:
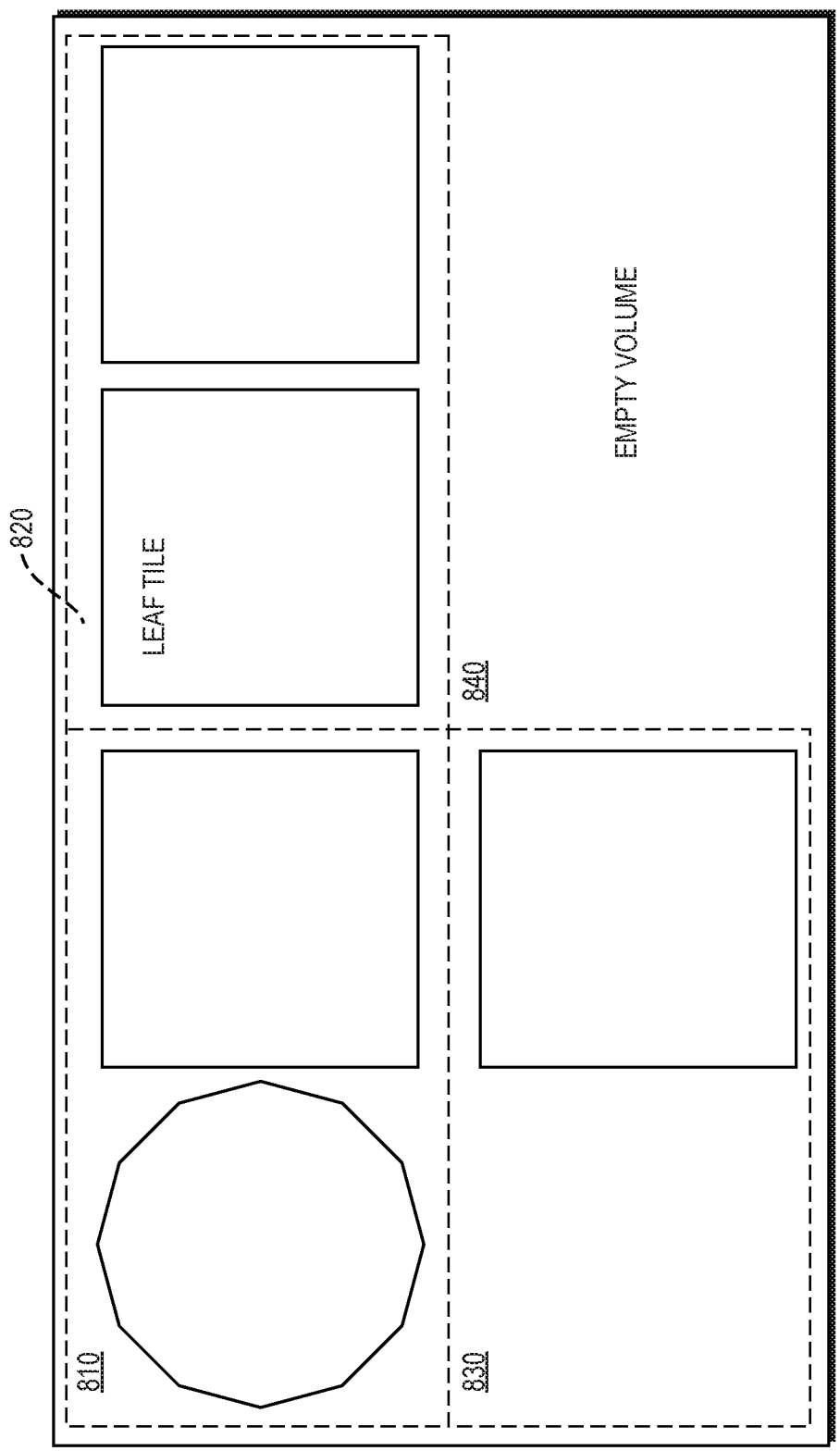
FIG. 8 is a graphical depiction of an example subdivision of a root tile into four child tiles, each occupying a portion of the space (here, a sub-area) of the root tile.

FIG. 8 is a graphical depiction of an example subdivision of the root tile 600 into four child tiles 810-840, each occupying a portion of the space (here, a area) of the root tile 600. As can be seen, at a LOD of the child tiles 810, the curved geometry of the circle may still appear "blocky", but somewhat less so than in FIG. 6 (here with 12 linear facets, rather than 6).

Figure 9:
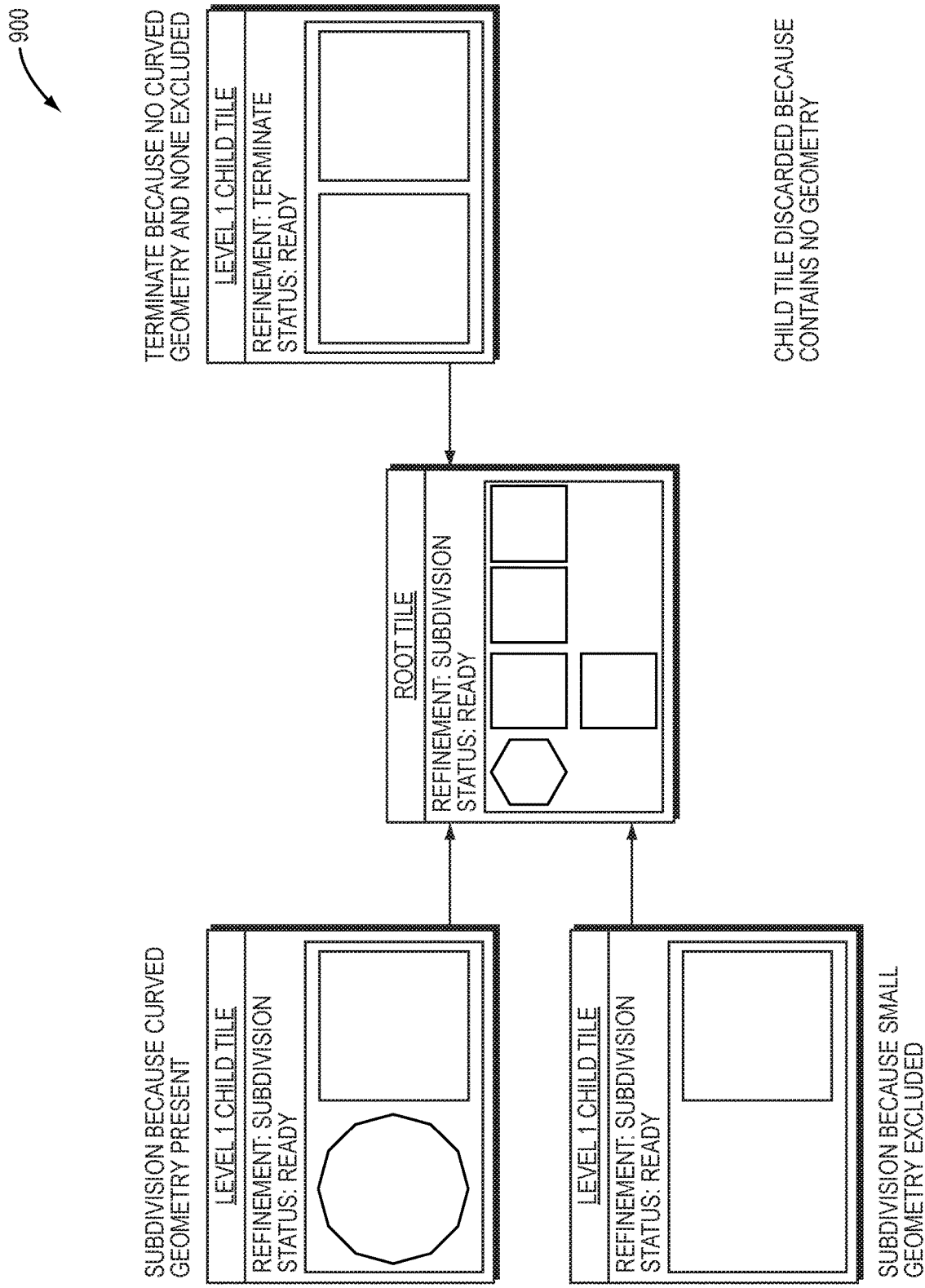
FIG. 9 is a diagram illustrating a third local HLOD sub-tree that an even later state, after a infrastructure modeling frontend module has loaded child tiles.

FIG. 9 is a diagram illustrating a third local HLOD sub-tree 900 that represents an even later state, after the infrastructure modeling frontend module 128 has loaded child tiles 810-840. By repeated execution of step 425-450 of FIG. 4 with the selected tile being each child tile, it may be determined that some child tiles requires further refinement by application of a multiple-child tile refinement strategy due to presence of curved geometry or exclusion of some geometry, while others are marked as terminating nodes being already at a maximal resolution or discarded as including no geometry.

Figure 10:
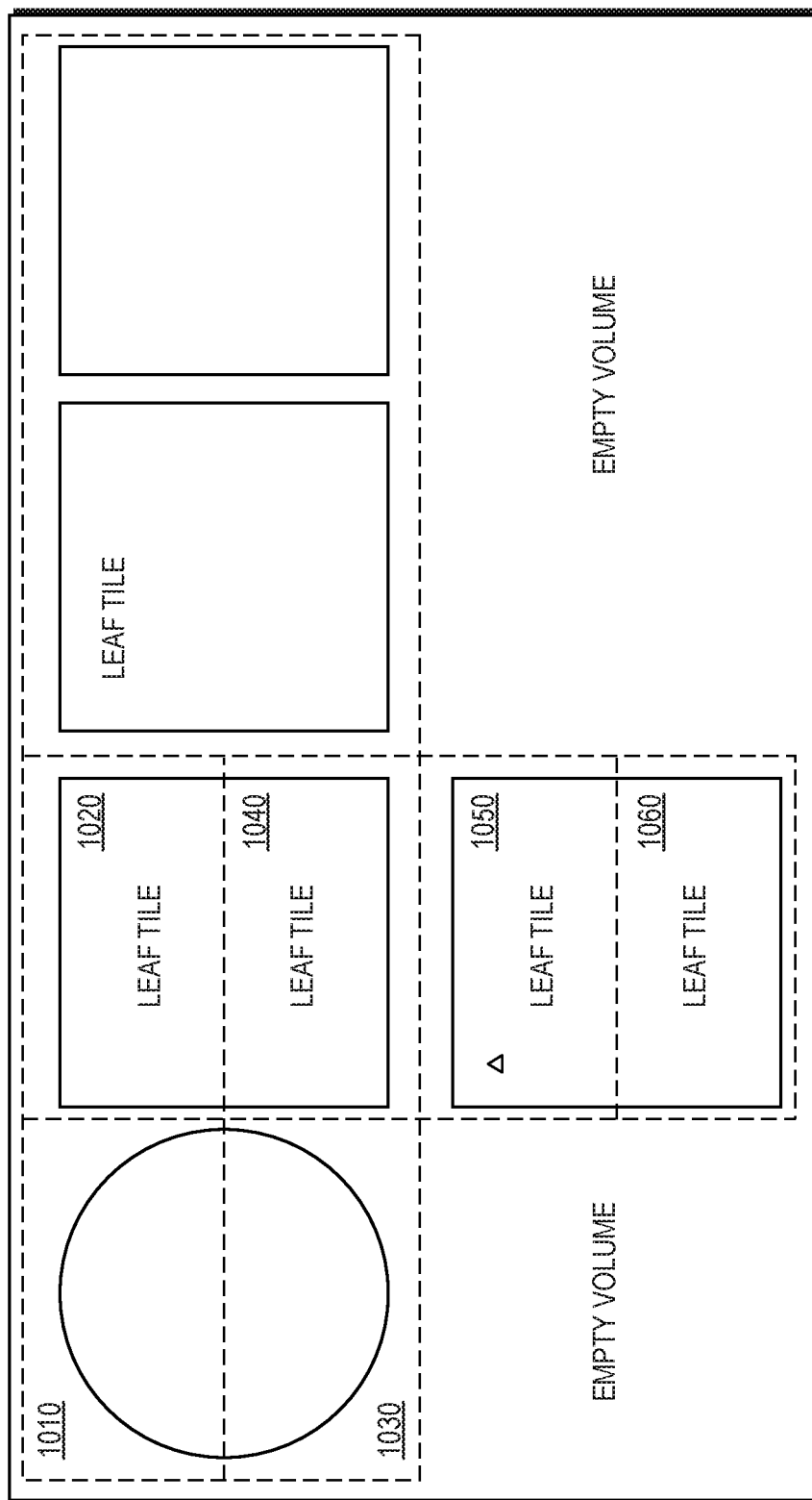
FIG. 10 is a graphical depiction of an example subdivision of at least some child tiles into second level child tiles.

FIG. 10 is a graphical depiction of an example subdivision of at least some of the child tiles 810, 830 (now referred to as first-level child tiles) into second-level child tiles 1010-1060, each occupying a portion of the space (here, a sub-area) of the respective first-level child tile. As can be seen, at a LOD of the second-level child tiles 1010, 1030, the curved geometry of the circle begins to appear smooth.

Figure 11:
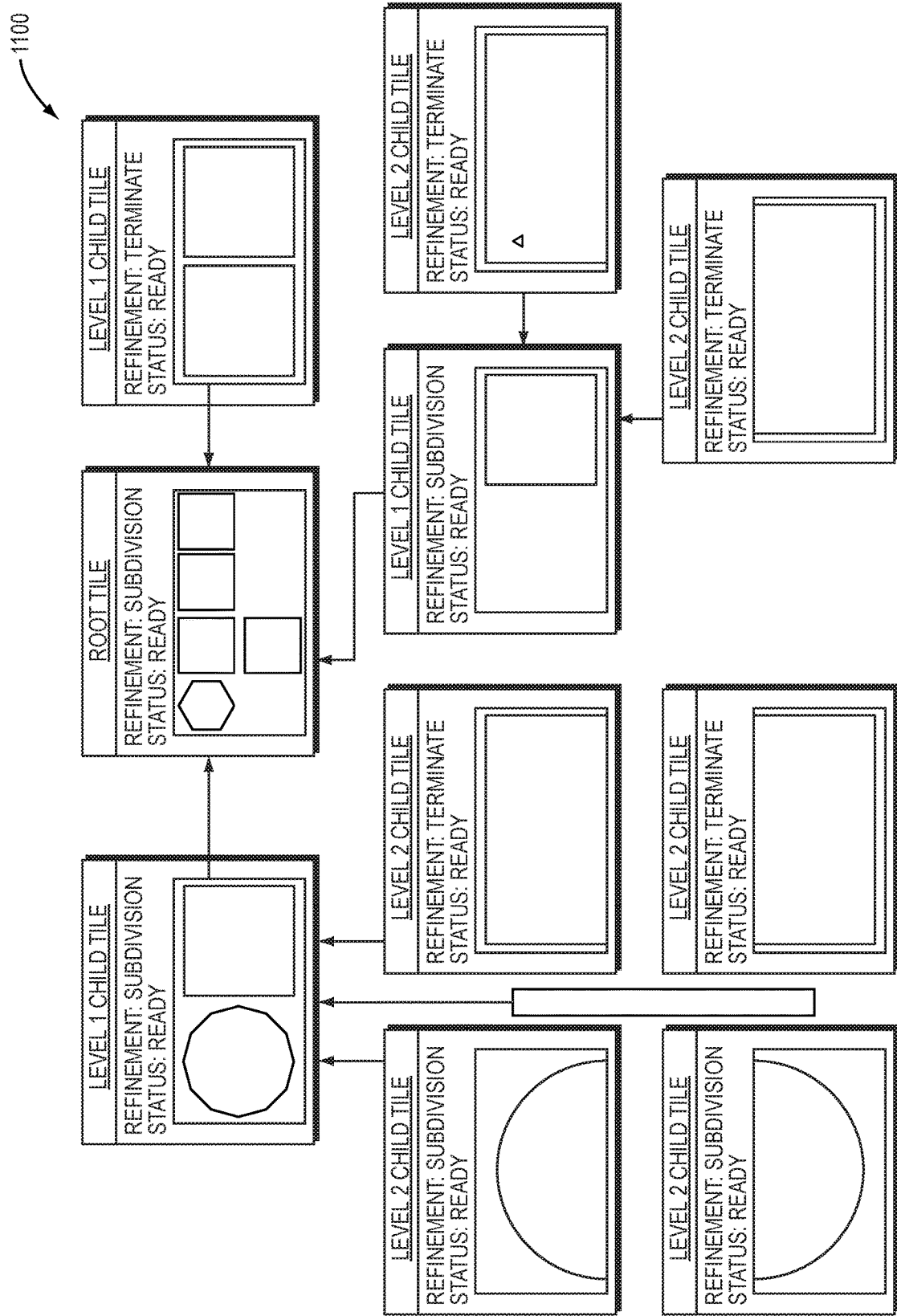
FIG. 11 is a diagram illustrating a fourth local HLOD sub-tree representing a still later state, after an infrastructure modeling frontend module has loaded second-level child tiles.

FIG. 11 is a diagram illustrating a fourth local HLOD sub-tree 1100 representing a still later state, after the infrastructure modeling frontend module 128 has loaded second-level child tiles 1010-1060. By again repeated execution of step 425-450 of FIG. 4 with the selected tile being each second-level child tile, further refinements may be determined.

Figure 12:
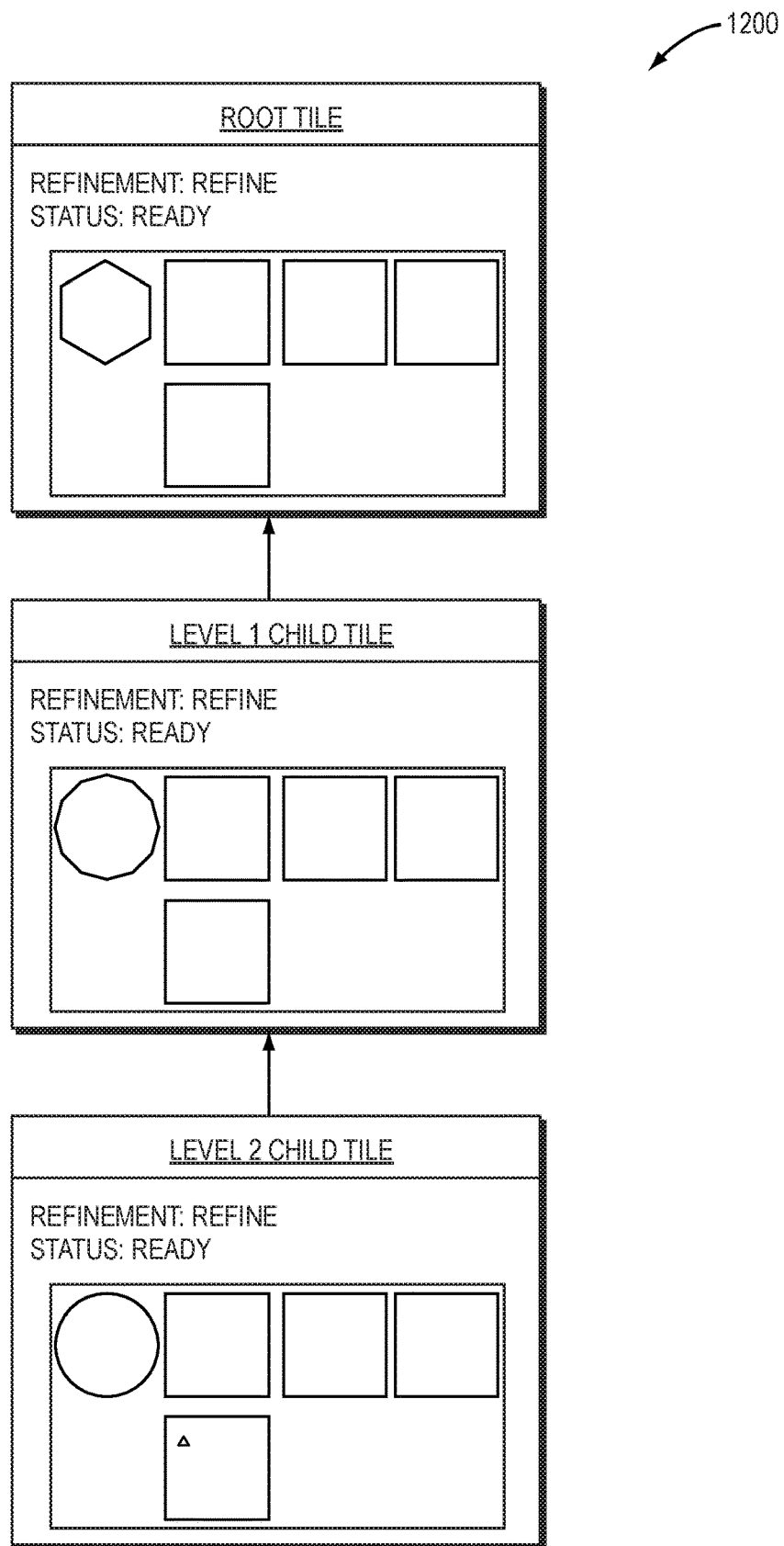
FIG. 12 is a local HLOD sub-tree illustrating application of a single-tile refinement strategy.

The illustrative example of FIGS. 5-11 utilizes a multiple-child tile refinement strategy for each refinement. It should be understood that the strategy may be replaced for some (or all) of the refinements by a single-tile refinement strategy that, for a given parent tile, generates a single child tile occupying the same space (e.g., volume) as the parent tile, but has a higher resolution than the parent tile (e.g., a higher number of pixels). FIG. 12 is a local HLOD sub-tree 1200 illustrating application of a single-tile refinement strategy. Such HLOD sub-tree 1200 may have be generated by repeated execution of step 425-450 to the example root tile 600 of FIG. 6, applying a single-tile refinement strategy at each level. As can be seen, the HLOD sub-tree 1200 is linear, with each node representing a tile that occupies the same space (here, area) as the root tile but having a higher resolution, such that curved geometry of the circle may appears less blocky (i.e. less faceted) as one progresses to lower-level child tiles.

In summary, techniques are described above for refining tiles of a HLOD tree into child tiles utilizing a single-tile refinement strategy for at least some refinements. It should be understood that a wide variety of adaptations and modifications may be made to the techniques. Further, in general, functionality may be implemented in software, hardware or various combinations thereof. Software implementations may include electronic device-executable instructions (e.g., computer-executable instructions) stored in a non-transitory electronic device-readable medium (e.g., a non-transitory computer-readable medium), such as a volatile memory, a persistent storage device, or other tangible medium. Hardware implementations may include logic circuits, application specific integrated circuits, and/or other types of hardware components. Further, combined software/hardware implementations may include both electronic device-executable instructions stored in a non-transitory electronic device-readable medium, as well as one or more hardware components. Above all, it should be understood that the above description is meant to be taken only by way of example.

What is claimed is:

1. A method comprising:
    building, by software executing on one or more computing devices, a hierarchical level of detail (HLOD) sub-tree that supports a view of a model, the HLOD sub-tree including nodes representing tiles, the building to include at least:
        selecting a node in the HLOD sub-tree, the selected node representing a tile having a resolution and occupying an area or volume,
        requesting information that includes metadata describing geometry of the tile, determining whether the tile requires refinement based on the metadata describing geometry, wherein the tile is determined to require refinement in response to the metadata describing geometry indicating at least some geometry is excluded from the tile due to size or curved geometry is present in the tile, and in response to the tile requiring refinement, applying a refinement strategy selected from one or more tile refinement strategies, the one or more tile refinement strategies including a single-tile refinement strategy that generates a single child node for the selected node in the HLOD sub-tree, the single child node representing a child tile that occupies an area or volume that extends over the entire area or volume of the tile but has a higher resolution than the tile; and displaying, by the software, the view of the model by showing one or more tiles represented by nodes of the HLOD sub-tree on a display screen.

2. The method of claim 1, wherein the one or more tile refinement strategies further include a multiple-child tile refinement strategy that generates multiple child nodes for the selected node in the HLOD sub-tree, the multiple child nodes representing multiple child tiles that each occupy an area or volume that extends over a portion of the area or volume of the tile but has a higher resolution than the tile.

3. The method of claim 1, wherein the information comprises tile contents and the refinement is refinement with tile contents.

4. The method of claim 3, wherein the tile contents include a geometry set with geometry that contributes visibly at the resolution of the tile and the metadata describing geometry includes at least a measure of geometry.

5. The method of claim 4, wherein the determining whether the tile requires refinement with tile contents determines whether the tile requires refinement also based on the measure of geometry.

6. The method of claim 5, wherein the building further includes:
in response to the tile not requiring refinement with tile contents, treating the node that represents the tile as a terminating node in the HLOD sub-tree.

7. The method of claim 5, wherein the building further includes:
in response to the tile including no geometry, discarding tile contents of the tile.

8. The method of claim 1, wherein the building further includes:
requesting metadata describing geometry of a second tile represented by a second selected node in the HLOD sub-tree, without requesting tile contents of the second tile,
determining whether the second tile requires refinement without tile contents based on the metadata describing geometry, and
in response to the second tile requiring refinement without tile contents, applying a multiple-child tile refinement strategy to the second tile that generates multiple child nodes for the second selected node in the HLOD sub-tree, the multiple child nodes representing multiple child tiles that each occupy an area or volume that extends over a portion of the area or volume of the second tile but has a higher resolution than the second tile.

9. The method of claim 8, wherein the determining whether the second tile requires refinement without tile contents determines the second tile requires refinement based on the measure of geometry exceeding a predetermined threshold.

10. The method of claim 8, wherein the building further includes:
in response to the second tile including no geometry, treating the second selected node that represents the second tile as a terminating node in the HLOD sub-tree.

11. The method of claim 8, wherein the building further includes:
in response to the second tile not requiring refinement without tile contents and including at least some geometry, proceeding to request tile contents for the second tile.

12. The method of claim 1, wherein the software is a frontend module, the one or more computing devices include a local computing device operated by an end-user, and the HLOD sub-tree is a local HLOD sub-tree.

13. The method of claim 12, further comprising:
computing, by a backend module executing on a remote computing device, the area or volume of the tile;
processing, by the backend module, geometry within the area or volume of the tile;
encoding, by the backend module, the geometry into tile contents;
transmitting tile contents to the frontend module.

14. The method of claim 1, wherein the model is an infrastructure model that models a physical structure or object that has been built, or is planned to be built, in the real-world.

15. A method comprising:
receiving, by software executing on one or more computing devices, a request to display a view of a model on a display screen;
requesting metadata describing geometry of the model in a space occupied in the view;
building, by the software, a hierarchical level of detail (HLOD) tree that supports the view based on the metadata, the HLOD tree including at least one node that represents a tile that has a single child node that represents a child tile that occupies an area or volume that extends over the entire area or volume of the tile represented by the node but has a higher resolution than the tile represented by the node; and
displaying, by the software, the view of the model by showing one or more tiles represented by nodes of the HLOD tree on the display screen.

16. The method of claim 15, wherein the HLOD tree includes at least one other node that represents another tile that has multiple child nodes, the multiple child nodes representing multiple child tiles that each occupy an area or volume that extends over a portion of the area or volume of the another tile but has a higher resolution than the another tile.

17. The method of claim 16, wherein the software is a frontend module, the one or more computing devices include a local computing device operated by an end-user, the HLOD tree is a local HLOD tree, and the requesting requests the metadata describing geometry from a backend module executing on a remote computing device.

18. A non-transitory electronic device readable medium having instructions stored thereon, the instructions when executed by one or more processors of one or more computing devices configured to:

build a hierarchical level of detail (HLOD) sub-tree that supports a view of a model, the HLOD sub-tree including nodes representing tiles, the building to include at least:
  selecting a node in the HLOD sub-tree, the selected node representing a tile having a resolution and occupying an area or volume,
  determining whether the tile requires refinement, wherein the tile is determined to require refinement in response to metadata describing geometry indicating at least some geometry is excluded from the tile due to size or curved geometry is present in the tile, and
  in response to the tile requiring refinement, applying a refinement strategy selected from a set of tile refinement strategies, the set of tile refinement strategies including at least a single-tile refinement strategy that generates a single child node for the tile in the HLOD sub-tree, the single child node representing a child tile that occupies an area or volume that extends over the entire area or volume of the tile represented by the selected node but has a higher resolution than the tile represented by selected node, and a multiple-child tile refinement strategy that generates multiple child nodes for the selected node in the HLOD, the multiple child nodes representing multiple child tiles that each occupy an area or volume that extends over a portion of the area or volume of the tile but has a higher resolution than the tile; and
  display the view of the model by showing one or more tiles represented by nodes of the HLOD sub-tree.

19. The non-transitory electronic device readable medium of claim 18, wherein the determining whether the tile requires refinement is based on metadata describing geometry that includes at least a measure of geometry.

* * * * *